United States Patent

Hayashi

[11] Patent Number: 5,770,899
[45] Date of Patent: Jun. 23, 1998

[54] LINEAR MOTOR

[75] Inventor: Yutaka Hayashi, Yokohama, Japan

[73] Assignee: Nikon Corporation, Tokyo, Japan

[21] Appl. No.: 934,815

[22] Filed: Sep. 22, 1997

Related U.S. Application Data

[63] Continuation of Ser. No. 558,985, Nov. 16, 1995, abandoned.

[30] Foreign Application Priority Data

Dec. 14, 1994 [JP] Japan ............................ 6-310501

[51] Int. Cl.$^6$ .................. H02K 41/00; H02K 41/02; H02K 41/035; H02K 9/00
[52] U.S. Cl. ............................ 310/12; 310/54
[58] Field of Search ................. 310/12, 13, 14, 310/54

[56] References Cited

U.S. PATENT DOCUMENTS 3,675,056  7/1972  Lenz .................................. 310/54

FOREIGN PATENT DOCUMENTS 6-41381  5/1994  Japan .

Primary Examiner—Clayton E. LaBalle
Attorney, Agent, or Firm—Shapiro and Shapiro

[57] ABSTRACT

A linear motor has two relatively members moveable a coil mounted to one of the two members, a magnet mounted to the other of the two members, a circulating pump for circulating a cooling medium via a circulating pipe in an outer tube surrounding the coil, a pressure detecting device for detecting the pressure of the cooling medium, and a control system for controlling the operation of the circulating pump based on the detected pressure value from the pressure detecting device.

101 Claims, 2 Drawing Sheets

LINEAR MOTOR

This is a continuation of application No. 08/558,985 filed Nov. 16, 1995, now abandoned.

BACKGROUND OF THE INVENTION

1. Field of the Invention

The present invention relates to a linear motor for relatively shifting two members, and more particularly to a linear motor used for apparatuses such as a semiconductor exposure apparatus requiring strict temperature control.

2. Related Background Art

Conventionally, in an exposure apparatus used to manufacture semiconductor devices or liquid crystal devices, a linear motor may be used as a drive device for a reticle stage on which a mask (a reticle, etc.) is disposed or a wafer stage on which a photosensitive substrate (wafer, glass plate, etc.) is disposed. In general, the exposure apparatus is utilized in an environment in which temperature is controlled constantly, so that it is desired to restrain a heating value in the linear motor. The linear motor is constituted of a stator fixed on a predetermined member and a slider fixed on a member to be shifted with respect to the predetermined member. When the stator includes a coil, the slider includes magnets, and when the stator includes magnets, the slider includes a coil. The motor in which the slider includes the magnets and the slider includes the coil is called a moving magnet-type linear motor. On the other hand, the motor in which the slider includes the coil and the stator includes the magnets is called a moving coil-type linear motor.

In both moving magnet and moving coil-type linear motors, as it is necessary to provide wide gaps between the coil and the magnets, as compared with an ordinary rotary motor, efficiency is bad and a heating value is high. In order to prevent temperature rise due to generation of heat of those linear motors, there is a well-known method in which a tube-like container is disposed so as to surround the coil whose heating value is large, and a medium whose temperature is controlled by a temperature controller is allowed to flow into the tube-like container to prevent temperature rise due to generation by heat of the coil.

FIG. 1 shows a cross-sectional view of a moving magnet-type linear motor. In FIG. 1, a linear motor 1 is constituted of a stator 2 and a slider 3. The stator 2 is provided with a tube-like container 6 having a rectangular shape in cross section so as to cover a coil 5 held by a coil holding plate 4. The coil holding plate 4 and the tube-like container 6 are secured to a stator supporting base 7. Outside the tube-like container 6 of the stator 2 is disposed the slider 3 with a magnet holding section 8 having a pair of magnets 9 secured on inside portions thereof. Fluid for temperature control is allowed to flow into a passage 10 in the tube-like container 6 as a cooling mechanism to absorb heat generated by the coil 5.

In the above-structured linear motor 1, since heat generated by the coil 5 is eliminated by the fluid for temperature control flowing through the passage 10 in the tube-like container 6, it is possible to restrain the harmful effects caused by temperature rise of the ambient air of the linear motor.

In the prior art, in order to improve the efficiency of using electric power of the linear motor further, it is necessary to narrow gaps between the coil and the magnets. However, in the linear motor of FIG. 1, as the tube-like container 6 used for the cooling mechanism, it is necessary to utilize the thinnest possible plate so as to narrow the gaps. In this case, for example, when a pipe provided from the linear motor to the temperature controller is bent or a valve is closed due to an erroneous operation, the pressure within the tube-like container is raised, whereby the tube-like container is swelled to cause it to contact with the magnets. Accordingly, the linear motor might be damaged or deformed.

FIG. 2 shows the effect of forming the plate thickness of a container 16 to be thin as compared with that of the tube-like container 6 of FIG. 1 (indicated by a broken line). FIG. 2 shows the state wherein the pressure of the fluid flowing through the container 16 for a cooling mechanism is raised and the tube-like container 16 is deformed outwardly. The magnets 9 and the tube-like container 16 are designed to have predetermined gaps between them and are not to be brought into direct contact with each other due to vibrations under normal conditions. However, as shown in FIG. 2, since the plate thickness of the tube-like container 16 is small, when the pressure of the fluid flowing through it increases, lateral side surfaces thereof are swelled outwardly and brought into contact with portions of surfaces of the magnets 9, resulting in the failure of the linear motor.

SUMMARY OF THE INVENTION

In view of the above problems, it is an object of the present invention to provide a linear motor capable of restraining the temperature rise due to generation of heat by a coil and surely preventing the contact of two relatively members movable.

A linear motor of the present invention has two members 32, 33 for moving relatively; a coil 35 mounted to one of the two members 32, 33; a magnet 39 mounted to the other of the two members 32, 33; a circulating pump 22 for circulating a cooling medium F via a circulating pipe 21, 24, 25 in an outer tube 36 surrounding the coil 35; a pressure detecting device 29 for detecting the pressure of the cooling medium F; and a control system 30 for controlling the operation of the circulating pump 22 based on the detected pressure value from the pressure detecting device 29.

In this case, it is preferable that the coil 35 is fixed to the stationary member 32 and the linear motor is a moving magnet type.

According to the linear motor of the present invention, the pressure of the cooling medium F flowing in the outer tube 36 of the linear motor is monitored by the pressure detecting device 29 and the operation of the circulating pump 22 is controlled by the control system 30. Therefore, if the operation of the circulating pump is controlled by the control system such that the pressure of the cooling medium F becomes equal to or less than a set pressure determined from the deformation limit of the outer tube, the two members will not contact with each other, thereby preventing the linear motor from breaking down due to that.

Also, when the coil 35 is fixed to the stationary member 32 and the linear motor is a moving magnet-type, the coil 35 of a heating element is fixed, so that the cooling mechanism is simple.

DETAILED DESCRIPTION OF THE PREFERRED EMBODIMENTS

A linear motor according to an embodiment of the present invention will be described hereinafter with reference to FIGS. 3 and 4. In this embodiment, the present invention is applied to a moving magnet-type linear motor.

Figure 1:
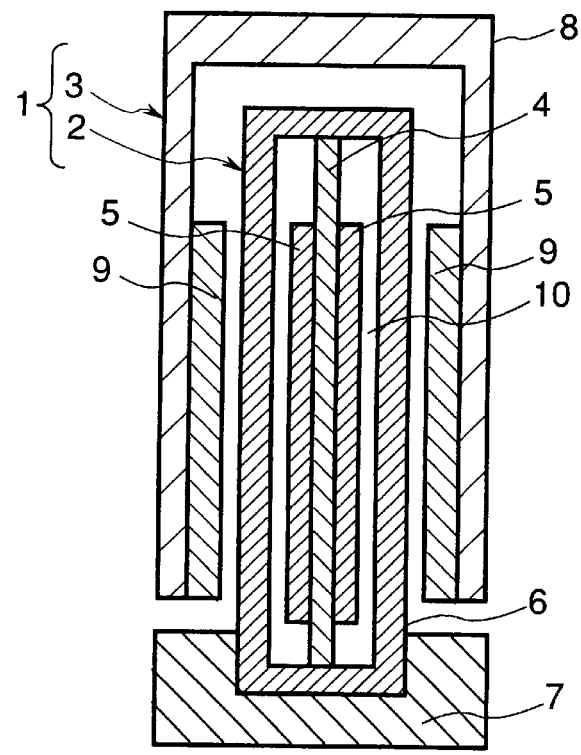
FIG. 1 is a cross-sectional view showing a conventional linear motor.
Figure 2:
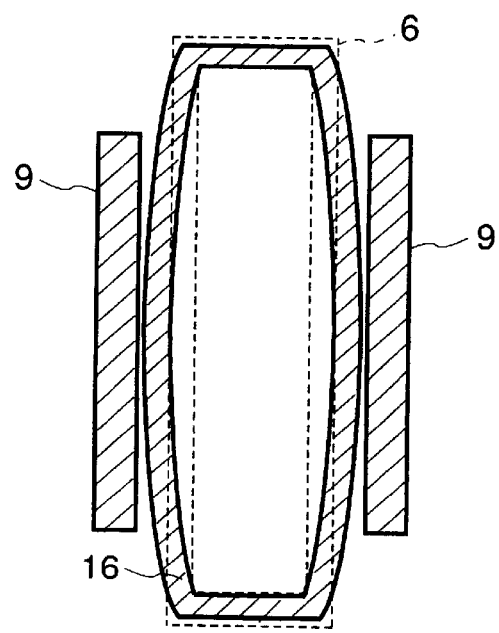
FIG. 2 is a cross-sectional view showing an important portion of a tube-like container of the linear motor of FIG. 1 when the plate thickness of the container is lessened.
Figure 3:
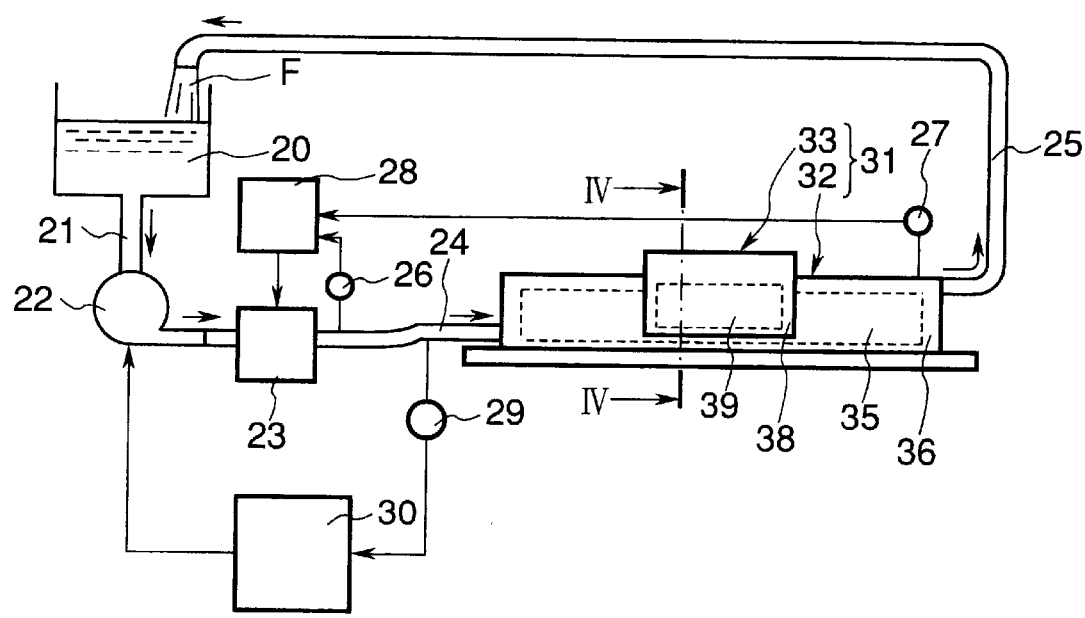
FIG. 3 is a block diagram showing a linear motor according to an embodiment of the present invention.

FIG. 3 shows the structure of the linear motor of this embodiment, and in FIG. 3, a reservoir tank 20 is filled with fluid F for cooling. The upper surface of the fluid F is open and the fluid pressure is 1 atm. The fluid F passes through a pipe 21 connected to the bottom of the reservoir tank 20, is pressurized by a circulating pump 22 to a pressure greater than 1 atm., and flows in a temperature controller 23. After the fluid F is controlled to have a predetermined temperature in the temperature controller 23, it enters a stator 32 of a linear motor main body 31 via a pipe 24.

Figure 4:
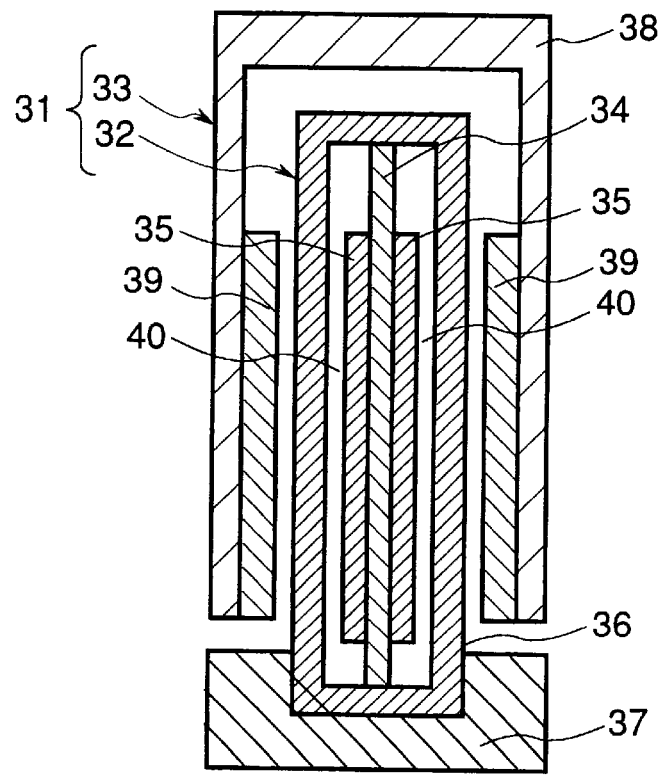
FIG. 4 is a cross-sectional view taken along the IV—IV line of FIG. 3.

FIG. 4 shows a cross-sectional view taken along the IV—IV line of the linear motor main body 31 of FIG. 3. In FIG. 4, the linear motor main body 31 is constructed of the stator 32 and a slider 33. For example, the stator 32 is secured to a base (not shown) of a wafer stage of an exposure apparatus used to manufacture semiconductor devices, etc. while the slider 33 is secured to an X-stage or Y-stage thereof to be moved with respect to the base. As the exposure apparatus, for example, a projection exposure apparatus of a step-and-scan system wherein a reticle and a wafer are scanned relatively with respect to a projection optical system is utilized. The linear motor main body 31 is utilized for driving the stage, e.g., in the scanning direction. The amount of movement of the stage in the scanning direction is measured by a laser interferometer with high precision.

Also, the slider 33 is constituted of a magnet holding section 38 having a U shape in cross section and a pair of magnets 39 fixed to the inside of the magnet holding section 38. The stator 32 is constituted of a stator supporting base 37, a tube-like container 36 having a rectangular shape in cross section which is fixed on the stator supporting base 37, and a coil holding plate 34 with a coil 35 mounted thereto which is fixed in the container 36. The fluid F for cooling is allowed to flow through a passage 40 surrounding the coil holding plate 34 in the tube-like container 36.

In FIG. 3, the fluid F flowing from the pipe 24 into an inlet of the tube-like container 36 of the linear motor main body 31 flows through the passage 40 (refer to FIG. 4) formed in the tube-like container 36 of the cooling mechanism provided so as to cover the surrounding area of the coil 35, and absorbs heat generated by the coil 35 to cause its temperature to rise. Then, the fluid F flows through a pipe 25 of (FIG. 3) connected to an outlet of the tube-like container 36 of the cooling mechanism and returns again to the reservoir tank 20. Arrows along the pipes 21, 24, 25 in FIG. 3 indicate the direction of the flow of the fluid F. The pipes 21, 24, 25 are provided with valves (not shown) such as stop valves and control valves, and the flow of the fluid F is controlled by those valves.

The temperature of the fluid F flowing out of the temperature controller 23 is measured by a temperature sensor 26 provided on the pipe 24 near the exit of the temperature controller 23. Also, the temperature of the fluid F flowing out of the linear motor main body 31 is measured by the temperature sensor 27. The temperatures of the fluid F measured by the temperature sensors 26, 27 are supplied to a central control system 28. The temperature controller 23 is controlled by the central control system 28 based on data of the temperature sensor 26. As an example, the temperature controller 23 sets the temperature of the fluid F at the inlet of the container 36 to the room temperature.

Also, the inflow pressure of the fluid F into the linear motor main body 31 is measured by a pressure sensor 29 provided on the pipe 24. The pressure of the fluid F measured by the pressure sensor 29 is supplied to a pump control system 30. The pump 22 is controlled by the pump control system 30 based on data of the pressure sensor 29. As the pressure sensor 29, it is possible to utilize a pressure sensor such as a semiconductor type, a diaphragm type, etc.

In this embodiment, the threshold pressure (gauge pressure) of the pressure sensor 29 is set to 0.5 atm. When the pressure measured by the pressure sensor 29 exceeds 0.5 atm., the output of the pump 22 is lowered by the pump control system 30, or the operation thereof is stopped. It is to be noted that the threshold pressure is the difference from the atmospheric pressure and when the threshold pressure is 0.5 atm., the actual pressure of the fluid F is 1.5 atm. Also, this set pressure value is determined in consideration of the characteristics and temperature of the fluid flowing in the tube-like container 36 and the structure material and additional strengthening structure of the tube-like container 36.

Also, as the fluid F, for example, water can be utilized when the insulating property of the coil 35 is preferable. However, as the fluid F, it is desirable to utilize liquid which is noncorrosive to the coil 35 and the tube-like container 36, nonconductive and chemically inert. In this embodiment, for example, fluoro inert liquid such as FLUORINART (trade name) is utilized as the fluid F.

Further, as the tube-like container 36, a non-magnetic material with high strength is selected. Specifically, its material is selected properly from stainless steel, copper, aluminum, copper alloy such as brass, phosphor bronze, cupro-nickel, chromium-copper, and alloy of aluminum and manganese, silicon, magnesium or zinc.

Next, the operation of the linear motor of this embodiment will be described.

As mentioned above, in order to narrow the gaps between the coil 35 and the magnets 39 so as not to lower the excitation force of the coil 35 to the magnets 39, it is preferable to make the thickness of the tube-like container 36 with the passage 40 of the fluid F for cooling the coil 35 as small as possible. However, when its thickness is too small, the container 36 is deformed due to the pressure of the fluid F flowing through the passage 40 of the tube-like container 36. Also, if the pressure of the fluid F flowing through the passage 40 is too low from the beginning, the flow speed of the fluid F is lowered, causing the efficiency of heat transfer to be deteriorated.

However, the pressure sensor 29 is provided in this embodiment, and when the pressure of the fluid F flowing through the container 36 exceeds 0.5 atm. in gauge pressure (1.5 atm. in absolute pressure), the output of the pump 22 is lowered. Therefore, it is sufficient to form the container 36 so as to withstand, e.g., about 1.7 atm. in gauge pressure, so that the plate thickness of the container 36 can be made considerably small. Therefore, in this embodiment, the gaps between the coil 35 and the magnets 39 can be narrowed. In addition, even if the pipe 25 is clogged, the container 36 will not be swelled and contact between the stator and the slider can be prevented.

Conventionally, when the pipe 25 returning from the linear motor main body 31 to the reservoir tank 20 is bent or the valves are closed due to an erroneous operation, the pressure in the tube-like container 36 is raised and the tube-like container 36 is swelled to cause it to contact the magnets 39. Thereby, the linear motor main body 31 is damaged. However, in this embodiment, before trouble occurs in the circulating passage of the fluid F and the pressure of the fluid F in the tube-like container 36 is raised rapidly, the operation of the pump 22 is stopped, so that the linear motor main body 31 will not be damaged.

In the linear motor of this embodiment, since heat generated by the coil portion is eliminated by allowing the fluid F to flow through the tube-like container 36 provided in the stator 32, the temperature of the ambient air of the linear motor will not be raised due to heat generated by the linear motor. Also, it is possible to prevent the failure of the linear motor main body 31 owing to the circulation of the fluid F, so that the linear motor of this embodiment can be used preferably for driving, e.g., a reticle stage and a wafer stage of an exposure apparatus used to manufacture semiconductors or liquid crystal display devices.

In this embodiment, the pressure of the fluid F is detected by the pressure sensor 29 disposed at the inlet of the linear motor main body 31 and the operation of the pump 22 is controlled based on the detected value. However, a flow rate sensor for measuring the flow rate of the fluid F may be provided at the outlet of the pipe 25 to the reservoir tank 20 or a proper portion in the pipe 24 or the pipe 25 and the measured value of the flow rate may be supplied to the pump control system 30. When the measured value of the flow rate sensor is changed rapidly, the output of the pump 22 is lowered by the pump control system 30 or the operation of the pump 22 is stopped.

Also, although the outlet of the pipe 25 to the reservoir tank 20 is open to the air in this embodiment, the reservoir tank 20 can be sealed. Further, the fluid F in the tube-like container 36 may be sucked in by providing an auxiliary circulating pump at the exit of the linear motor main body 31.

The present invention is applicable not only to a moving magnet-type linear motor but also to a moving coil-type linear motor.

The present invention is not limited to the above-described embodiment, and various structures can be made without departing from the scope of the present invention.

According to the linear motor of the present invention, if the pressure of a cooling medium is monitored by a pressure detecting device and the output of a circulating pump circulating the cooling medium is lowered when the pressure value measured by the pressure detecting device exceeds a preset value, deformation of an outer tube in which the cooling medium flows can be prevented. Therefore, it is possible to prevent two members respectively equipped with a coil and a magnet from being brought into contact with each other, thereby preventing the linear motor from being damaged. Further, by controlling the operation of the circulating pump such that the pressure of the cooling medium becomes constant, the amount of circulation of the cooling medium can be increased close to its limit. Accordingly, the efficiency of heat transfer (the efficiency of cooling) and the amount of heat transfer (the amount of cooling) of the cooling medium are increased, so that the temperature control function of the linear motor can be used to the maximum. Also, as the gap between the coil and the magnet can be reduced, the efficiency of using electric power is enhanced and the generation of heat is decreased.

Further, when the coil is fixed to the stationary member and the linear motor is a moving magnet-type, the coil of a heating element is secured, so the cooling mechanism is simplified. Furthermore, when the linear motor is used for driving, e.g., a stage of an exposure apparatus, influence to the temperature of the air around the light path of a laser interferometer for measuring the position of the stage can be reduced as compared with a moving coil-type linear motor.

What is claimed is:

1. A linear motor comprising:
   two relatively movable members;
   a coil mounted to one of said two members;
   a magnet mounted to the other of said two members;
   a tube surrounding said coil;
   a supply system that supplies fluid into said tube;
   a pressure detecting device that detects pressure of said fluid; and
   a control system that controls said supply system based on an output of said pressure detecting device to regulate the pressure of said fluid in said tube so as to inhibit deformation of said tube by said fluid.

2. A linear motor according to claim 1, further comprising:
   a cooling system that cools said fluid.

3. A linear motor according to claim 1, wherein one of said two members is fixed and said coil is mounted to said fixed member.

4. A linear motor according to claim 1, further comprising:
   a temperature sensor that measures temperature of said fluid so that the temperature of said fluid can be adjusted.

5. A linear motor according to claim 1, wherein said supply system includes a pump and said control system controls said pump based on the output of said pressure detecting device.

6. A linear motor according to claim 5, wherein said control system reduces an output of said pump when the output of said pressure detecting device exceeds a threshold value determined based on atmospheric pressure and a thickness of said tube.

7. A linear motor according to claim 5, wherein said control system stops an output of said pump when the output of said pressure detecting device exceeds a threshold value determined based on atmospheric pressure and a thickness of said tube.

8. An exposure apparatus comprising:
   a stage having two relatively movable members, said stage for carrying a mask or a photosensitive substrate thereon;
   a coil mounted to one of said two members;
   a magnet mounted to the other of said two members;
   a tube surrounding said coil;
   a supply system that supplies fluid into said tube;
   a pressure detecting device that detects pressure of said fluid; and
   a control system that controls said supply system based on an output of said pressure detecting device to regulate the pressure of said fluid in said tube so as to inhibit deformation of said tube by said fluid.

9. A method of cooling a linear motor comprising the steps of:
   supplying fluid into a tube surrounding a coil of said linear motor;
   measuring pressure of said fluid; and
   regulating the pressure of said fluid in said tube based on the measured pressure of said fluid so as to inhibit deformation of said tube by said fluid.

10. A method according to claim 9, wherein said step of regulating the pressure of said fluid includes adjusting the pressure of said fluid when the measured pressure of said fluid exceeds a threshold value determined based on atmospheric pressure and a thickness of said tube.

11. A method according to claim 9, wherein said step of regulating the pressure of said fluid includes a step of drawing said fluid into said tube based on the measured pressure of said fluid.

12. A linear motor comprising:

two relatively movable members;

a coil mounted to one of said two members;

a magnet mounted to the other of said two members;

a tube surrounding said coil;

a supply system that supplies fluid into said tube;

a detecting device that detects a parameter indicative of pressure of said fluid; and a control system that controls said supply system based on an output of said detecting device so as to inhibit deformation of said tube by pressure of said fluid.

13. A linear motor according to claim 12, wherein said supply system includes a pump and said control system controls said pump based on the output of said detecting device.

14. A linear motor according to claim 13, wherein said control system reduces an output of said pump when the output of said detecting device changes at more than a predetermined rate.

15. A linear motor according to claim 13, wherein said control system stops an output of said pump when the output of said detecting device changes at more than a predetermined rate.

16. A method of cooling a linear motor comprising the steps of:

supplying fluid into a tube surrounding a coil of said linear motor;

detecting a parameter indicative of pressure of said fluid; and regulating the supply of fluid to said tube based on the detected parameter so as to inhibit deformation of said tube by pressure of said fluid.

17. A method according to claim 16, wherein said step of regulating the supply of fluid includes adjusting the supply of fluid when the detected parameter changes at more than a predetermined rate.

18. A linear motor comprising:

two relatively movable members;

a coil mounted to one of said two members;

a magnet mounted to the other of said two members;

a tube surrounding said coil;

a supply system that supplies fluid into said tube; and a detecting device that detects a parameter indicative a detecting device that detects a parameter indicative of pressure of said fluid in said tube.

19. A linear motor according to claim 18, wherein said fluid is liquid.

20. A linear motor according to claim 18, further comprising:

a temperature sensor that measures temperature of said fluid in said tube.

21. A linear motor according to claim 18, wherein said detecting device directly detects pressure of said fluid.

22. A linear motor according to claim 18, further comprising:

a cooling system that cools said fluid.

23. A linear motor according to claim 18, further comprising:

a controller that controls an operation of said supply system based on an output of said detecting device.

24. A linear motor according to claim 23, wherein said controller controls said supply system to reduce an output of said supply system when a detection result of said detecting device exceeds a threshold value determined based on atmospheric pressure and a thickness of said tube.

25. A linear motor according to claim 23, wherein said controller controls the operation of said supply system to stop an output of said supply system when a detection result of said detecting device exceeds a threshold value determined based on atmospheric pressure and a thickness of said tube.

26. A linear motor according to claim 23, wherein said controller reduces or stops an output of said supply system when a parameter of an output of said detecting device exceeds a predetermined limit.

27. A linear motor according to claim 18, wherein one of said two members is fixed, and said coil is mounted to said one member.

28. A linear motor according to claim 18, further comprising:

a suction device that is connected to said tube, and that sucks said fluid supplied in said tube based on an output of said detecting device.

29. A linear motor according to claim 18, wherein said detecting device detects flow rate of said fluid.

30. A linear motor comprising:

two relatively moveable members;

a coil mounted to one of said two members;

a magnet mounted to the other of said two members;

a tube surrounding said coil;

a supply system that supplies fluid into said tube; and a controller that is connected to said supply system, and that adjusts pressure of said fluid in said tube.

31. A linear motor according to claim 30, wherein said fluid is liquid.

32. A linear motor according to claim 30, further comprising:

a temperature sensor that measures temperature of said fluid in said tube.

33. A linear motor according to claim 32, wherein said controller adjusts pressure of said fluid in accordance with an output of said temperature sensor.

34. A linear motor according to claim 30, further comprising:

a cooling system that cools said fluid.

35. A linear motor comprising:

a coil;

a tube surrounding said coil;

a member that is opposed to said tube at a predetermined distance, and that is movable relative to said tube;

a supply system that supplies fluid into said tube; and a detecting device that detects a parameter indicative of a deformation state of said tube.

36. A linear motor according to claim 35, wherein said member is a magnet.

37. A linear motor according to claim 35, wherein said detecting device directly detects pressure of said fluid in said tube.

38. A linear motor according to claim 35, wherein said fluid is liquid.

39. A linear motor according to claim 35, wherein said detecting device detects a parameter related to pressure of said fluid.

40. A linear motor according to claim 35, further comprising: a cooling system that cools said fluid.

41. A linear motor according to claim 35, further comprising:
a controller that controls an operation of said supply system based on an output of said detecting device.

42. A linear motor according to claim 41, wherein said controller controls said supply system to reduce an output of said supply system when a detection result of said detecting device exceeds a threshold value determined based on atmospheric pressure and a thickness of said tube.

43. A linear motor according to claim 41, wherein said controller controls said supply system to stop an output of said supply system when a detection result of said detecting device exceeds a threshold value determined based on atmospheric pressure and a thickness of said tube.

44. A linear motor according to claim 41, wherein said controller reduces or stops an output of said supply system when a parameter of an output of said detecting device exceeds a predetermined limit.

45. A linear motor according to claim 35, wherein said coil is mounted to a fixed member of said linear motor.

46. A linear motor according to claim 35, further comprising:
a suction device that is connected to said tube, and that sucks said fluid supplied in said tube based on an output of said detecting device.

47. A linear motor according to claim 35, wherein said detecting device detects flow rate of said fluid.

48. A linear motor comprising:
a coil;
a tube surrounding said coil;
a supply system that supplies fluid into said tube; and
a detecting device that detects a parameter indicative of pressure of said fluid in said tube.

49. A linear motor according to claim 48, wherein said fluid is liquid.

50. A linear motor according to claim 48, further comprising:
a temperature sensor that measures temperature of said fluid in said tube.

51. A linear motor according to claim 48, wherein said detecting device directly detects pressure of said fluid.

52. A linear motor according to claim 48, further comprising:
a cooling system that cools said fluid.

53. A linear motor according to claim 48, further comprising:
a controller that controls an operation of said supply system based on an output of said detecting device.

54. A linear motor according to claim 53, wherein said controller controls said supply system to reduce an output of said supply system when a detection result of said detecting device exceeds a threshold value determined based on atmospheric pressure and a thickness of said tube.

55. A linear motor according to claim 53, wherein said controller controls said supply system to stop an output of said supply system when a detection result of said detecting device exceeds a threshold value determined based on atmospheric pressure and a thickness of said tube.

56. A linear motor according to claim 53, wherein said controller reduces or stops an output of said supply system when a parameter of an output of said detecting device exceeds a predetermined limit.

57. A linear motor according to claim 48, wherein said coil is mounted to a fixed member of said linear motor.

58. A linear motor according to claim 48, further comprising:
a suction device that is connected to said tube, and that sucks said fluid supplied in said tube based on an output of said detecting device.

59. A linear motor according to claim 48, wherein said detecting device detects flow rate of said fluid.

60. An operation method of a linear motor comprising the steps of:
supplying fluid into a tube surrounding a coil mounted to one of two relatively moveable members of said linear motor, a magnet being mounted to the other of said two members; and
detecting a parameter indicative of pressure of fluid in said tube.

61. A method according to claim 60, wherein said fluid is liquid.

62. A method according to claim 60, wherein said parameter is temperature of said fluid.

63. A method according to claim 60, wherein said parameter is pressure of said fluid.

64. A method according to claim 60, further comprising the step of cooling said fluid.

65. A method according to claim 60, further comprising the step of controlling said supplying based on a result of said detecting.

66. A method according to claim 65, wherein said controlling includes reducing the supply of fluid to said tube when the result of said detecting exceeds a threshold value based on atmospheric pressure and a thickness of said tube.

67. A method according to claim 65, wherein said controlling includes stopping the supply of fluid to said tube when the result of said detecting exceeds a threshold value based on atmospheric pressure and a thickness of said tube.

68. A method according to claim 65, wherein said controlling includes reducing or stopping the supply of fluid to said tube when a parameter based on change of the detecting result exceeds a predetermined limit.

69. A method according to claim 60, wherein said member to which the coil is mounted is a fixed member.

70. A method according to claim 60, wherein said supplying includes sucking fluid into said tube with a suction device connected to said tube, and further comprising the step of controlling said suction device based on a result of said detecting.

71. A method according to claim 60, wherein said parameter is flow rate of said fluid.

72. An operation method of a linear motor comprising the steps of:
supplying fluid into a tube surrounding a coil mounted to one of two relatively moveable members of said linear motor, a magnet being mounted to the other of said two members; and
adjusting the pressure of said fluid in said tube with a controller that is connected to said supply system.

73. A method according to claim 72, wherein said fluid is liquid.

74. A method according to claim 72, further comprising measuring temperature of said fluid in said tube with a temperature sensor.

75. A method according to claim 74, wherein said controller adjusts pressure of said fluid in accordance with an output of said temperature sensor.

76. A method according to claim 72, further comprising the step of cooling said fluid.

77. An operation method of a linear motor comprising:

supplying fluid into a tube surrounding a coil of said linear motor, said tube being opposed at a predetermined distance to a member of said linear motor that is moveable relative to said tube; and detecting a parameter indicative of a deformation state of said tube.

78. A method according to claim 77, wherein said member is a magnet.

79. A method according to claim 77, wherein said parameter is pressure of fluid in said tube.

80. A method according to claim 77, wherein said fluid is liquid.

81. A method according to claim 77, wherein said parameter is related to pressure of said fluid.

82. A method according to claim 77, further comprising the step of cooling said fluid.

83. A method according to claim 77, further comprising the step of controlling said supplying based on a result of said detecting.

84. A method according to claim 83, wherein said controlling includes reducing the supply of fluid to said tube when the result of said detecting exceeds a threshold value based on atmospheric pressure and a thickness of said tube.

85. A method according to claim 83, wherein said controlling includes stopping the supply of fluid to said tube when the result of said detecting exceeds a threshold value based on atmospheric pressure and a thickness of said tube.

86. A method according to claim 83, wherein said controlling includes reducing or stopping the supply of fluid to said tube when a parameter based on change of the detecting result exceeds a predetermined limit.

87. A method according to claim 77, wherein said coil is mounted to a fixed member of said linear motor.

88. A method according to claim 77, wherein said supplying includes sucking fluid into said tube with a suction device connected to said tube, and further comprising the step of controlling said suction device based on a result of said detecting.

89. A method according to claim 77, wherein said parameter is flow rate of said fluid.

90. An operation method of a linear motor comprising:

supplying fluid into a tube surrounding a coil of said linear motor; and detecting a parameter indicative of pressure of said fluid in said tube.

91. A method according to claim 90, wherein said fluid is liquid.

92. A method according to claim 90, wherein said parameter is temperature of said fluid.

93. A method according to claim 90, wherein said parameter is pressure of said fluid.

94. A method according to claim 90, further comprising the step of cooling said fluid.

95. A method according to claim 90, further comprising the step of controlling said supplying based on a result of said detecting.

96. A method according to claim 95, wherein said controlling includes reducing the supply of fluid to said tube when the result of said detecting exceeds a threshold value based on atmospheric pressure and a thickness of said tube.

97. A method according to claim 95, wherein said controlling includes stopping the supply of fluid to said tube when the result of said detecting exceeds a threshold value based on atmospheric pressure and a thickness of said tube.

98. A method according to claim 95, wherein said controlling includes reducing or stopping the supply of fluid to said tube when a parameter based on change of the detecting result exceeds a predetermined limit.

99. A method according to claim 90, wherein said coil is mounted to a fixed member of said linear motor.

100. A method according to claim 90, wherein said supplying includes sucking fluid into said tube with a suction device connected to said tube, and further comprising the step of controlling said suction device based on a result of said detecting.

101. A method according to claim 90, wherein said parameter is flow rate of said fluid.

\* \* \* \* \*